(12) United States Patent
Pavlik et al.

(10) Patent No.: US 12,330,289 B2
(45) Date of Patent: Jun. 17, 2025

(54) DETERMINING THE CENTER POSITION OF A SEMICONDUCTOR WAFER

(71) Applicant: WaferPath, Inc., Milpitas, CA (US)

(72) Inventors: Frantisek Pavlik, Los Altos Hills, CA (US); James Thomas McCartney, III, Conroe, TX (US)

(73) Assignee: WaferPath, Inc., Milpitas, CA (US)

( * ) Notice: Subject to any disclaimer, the term of this patent is extended or adjusted under 35 U.S.C. 154(b) by 824 days.

(21) Appl. No.: 17/396,039

(22) Filed: Aug. 6, 2021

(65) Prior Publication Data

US 2022/0063109 A1 Mar. 3, 2022

Related U.S. Application Data

(60) Provisional application No. 63/070,428, filed on Aug. 26, 2020.

(51) Int. Cl.
*B25J 15/06* (2006.01)
*B25J 11/00* (2006.01)
(Continued)

(52) U.S. Cl.
CPC ......... *B25J 11/0095* (2013.01); *B25J 13/088* (2013.01); *B25J 15/0616* (2013.01);
(Continued)

(58) Field of Classification Search
CPC .. B25J 11/0095; B25J 13/088; B25J 15/0616; B25J 19/021; B25J 13/089;
(Continued)

(56) References Cited

U.S. PATENT DOCUMENTS 6,075,334 A * 6/2000 Sagues .............. H01L 21/67766
414/416.03
10,186,438 B2 * 1/2019 Fischer ................ G01B 11/272
(Continued)

FOREIGN PATENT DOCUMENTS

CN 101552219 A * 10/2009 ........... G05B 19/402
JP 6727048 B2 * 7/2020 ....... H01L 21/67092
(Continued)

OTHER PUBLICATIONS

CN101552219 with EN translation (Year: 2009).*
(Continued)

*Primary Examiner* — Jacob S. Scott
*Assistant Examiner* — Erin Morris
(74) *Attorney, Agent, or Firm* — Schwegman Lundberg & Woessner, P.A.

(57) ABSTRACT

A robot system includes a robot arm and an end effector coupled to the robot arm for receiving an item, the end effector having an aperture defined therein that is partially covered by an item when the item is received by the end effector. The system may include data processors in communication with the robot arm and an input to receive data from a sensor that can detect obstruction thereof as the end effector is moved past the sensor with the aperture aligned with the sensor. The robot system is able to determine a center of the item from positional information captured during sensor transitions. The robot system can then place the item such that the determined center of the item is received at an intended center location. Also disclosed is an end effector coupled to the robot arm for receiving an item, the end effector having sensor regions that are obscured when an item is received by the end effector, and a sensor module directed at the sensor regions on the end effector, the sensor module and the sensor regions in combination being operable to detect when the item obscures the sensor regions.

20 Claims, 10 Drawing Sheets

(51) Int. Cl.
 B25J 13/08 (2006.01)
 B25J 19/02 (2006.01)
 H01L 21/67 (2006.01)
 H01L 21/687 (2006.01)
(52) U.S. Cl.
 CPC ...... B25J 19/021 (2013.01); H01L 21/67259 (2013.01); H01L 21/68707 (2013.01)
(58) Field of Classification Search
 CPC ......... H01L 21/68707; H01L 21/67303; H01L 21/67766
 See application file for complete search history.

(56) References Cited

U.S. PATENT DOCUMENTS

| | | | | |
|---|---|---|---|---|
| 2008/0118338 | A1* | 5/2008 | Huang | H01L 21/68707 901/30 |
| 2009/0118862 | A1* | 5/2009 | Genetti | B25J 9/1694 901/3 |
| 2012/0101633 | A1* | 4/2012 | Rodnick | H01L 21/67259 700/253 |
| 2014/0340509 | A1* | 11/2014 | Fairbairn | H05K 13/0069 348/95 |
| 2020/0365436 | A1* | 11/2020 | Houng | G01N 29/04 |

FOREIGN PATENT DOCUMENTS

| | | | | |
|---|---|---|---|---|
| KR | 20210031805 | A * | 3/2021 | |
| TW | I283743 | * | 7/2007 | |
| WO | WO-9205920 | A1 * | 4/1992 | |
| WO | WO-2012052865 | A2 * | 4/2012 | ............ B25J 9/1612 |
| WO | WO-2016129102 | A1 * | 8/2016 | ........... B25J 11/0095 |

OTHER PUBLICATIONS

JP6727048 with EN translation (Year: 2020).*
KR20210031805 with EN translation (Year: 2021).*
TWI283743 with EN translation (Year: 2007).*

* cited by examiner

DETERMINING THE CENTER POSITION OF A SEMICONDUCTOR WAFER

RELATED APPLICATION DATA

This application claims the benefit of U.S. Provisional Patent Application No. 63/070,428 filed Aug. 26, 2020, the contents of which are incorporated herein by reference as if explicitly set forth.

BACKGROUND

The concepts described herein relate to the field of robotics generally and more particularly but not exclusively to wafer transfer robots used in semiconductor fabrication facilities. To ensure high fab productivity, wafer transfer robots need to transfer wafers fast but securely, to ensure fast throughput without risking damage to wafers, the value of which can be substantial.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

DETAILED DESCRIPTION

Figure 1:
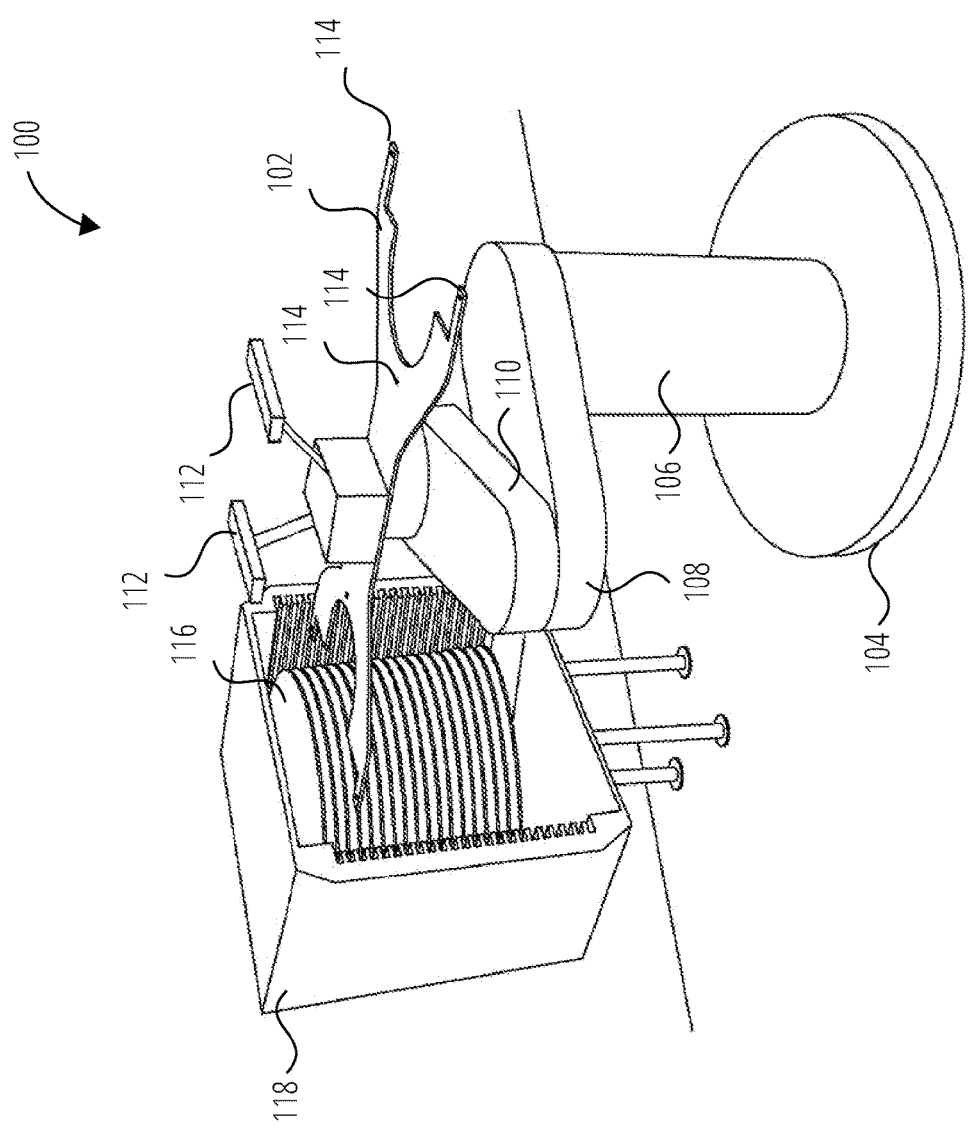
FIG. 1 illustrates a wafer transfer robot in an example embodiment.

FIG. 1 illustrates a wafer transfer robot 100 according to one example embodiment. The wafer transfer robot 100 includes a base 104, a support column 106, a robot arm including one or more segments 108, 110, two end effectors 102 and two wafer edge detection modules 112. In some cases, the wafer transfer robot 100 may be located on a track that can be used to move the wafer transfer robot 100 back and forth between different locations. As will be discussed in more detail with reference to FIG. 5, the wafer edge detection modules 112 are used to detect points along the edge of a wafer 116.

Located on each end effector 102 are one or more vacuum ports 114. The vacuum ports 114 are used to secure an item such as a wafer 116 (illustrated in a cassette 118) on top of the end effector 102. The vacuum ports 114 are coupled to a vacuum supply (not shown) via a channel underneath the end effector 102 that is in turn coupled to a vacuum supply tube that passes through the segments 108, 110, the support column 106 and the base 104.

The support column 106 can be moved up and down and rotated about its primary axis under computer control, while segment 110 can similarly be rotated relative to segment 108 and the end effector 102 can be rotated relative to segment 110, also under computer control. In use in the situation illustrated in FIG. 1, the end effector 102 is moved underneath a wafer 116 and raised until the suction of the vacuum ports 114 engages the wafer 116, at which time the wafer can be withdrawn from the cassette 118. The wafer 116 is then transferred to another location (e.g. another cassette, a wafer prealigner, a wafer processing station etc.) by movements performed by the wafer transfer robot 100. As shown in FIG. 1, the wafer transfer robot 100 includes two opposed end effectors 102, but it will be appreciated that various configurations including varying numbers of end effectors 102 may be used.

Figure 2:
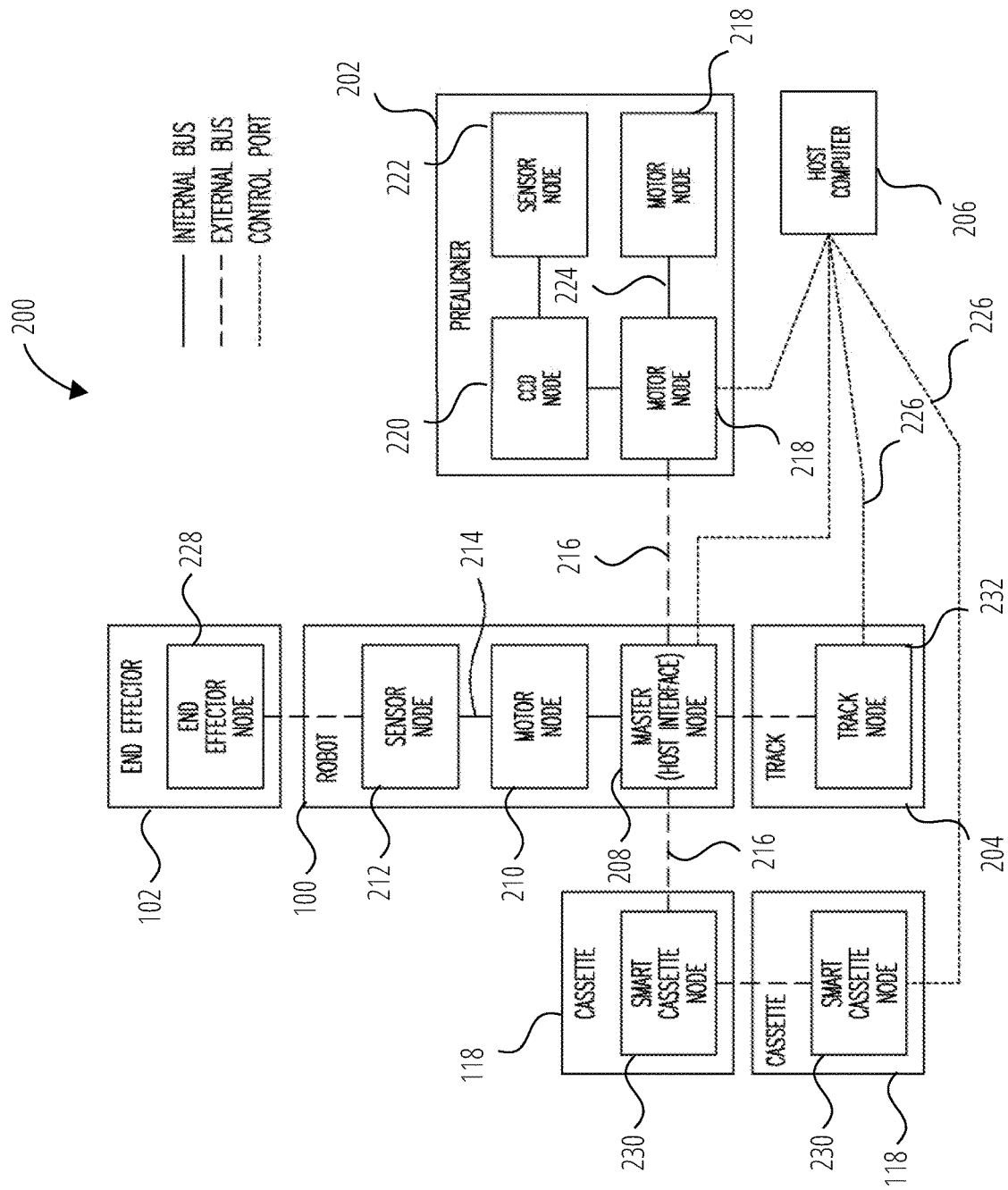
FIG. 2 illustrates an example of a wafer transfer system in which the wafer transfer robot of FIG. 1 may be used.

FIG. 2 is a schematic illustration of one example of a wafer transfer system 200 showing the computing elements and data paths associated with the wafer transfer robot 100 and related components such as an end effector 102, cassettes 118, a prealigner 202, a track 204 and a host computer 206. Additional or different components, for example a wafer inspection station, may be provided depending on the requirements of the fabrication facility.

As can be seen from the figure, wafer transfer robot 100 includes a master node 208, responsible for coordinating operations performed by other nodes, at least one motor node 210 and at least one sensor node 212. The master node serves to control the wafer transfer robot 100 while the motor nodes 218 serve to control motors that move the support column 106, segment 108 and 108 on one or more axes. The sensor nodes 212 receive and forward digital or analog data from various sensors that are used to control or characterize the operation of the robot, for control, feedback, diagnostics or other purposes. For example, sensors may include angular or linear positional sensors, vacuum sensors, optical sensors etc. as is known in the semiconductor processing field.

Communication between the master node 208, motor node 210 and the sensor node 212 of the wafer transfer robot 100 take place by means of an internal bus 214. The master node 208 communicates with the cassette 118, the prealigner 202, the track 204 and the end effector 102 by means of an external bus 216. The master node 208 is also communicatively coupled to the host computer 206 by a control link 226.

The prealigner 202 includes one or more motor nodes 218, an optical sensor node (in the illustrated example, a CCD node 220) and a sensor node 222. Communication within the prealigner 202 takes place over an internal bus 224. The prealigner 202 is communicatively coupled to the wafer transfer robot 100 by means of an external bus 216 and optionally to the host computer 206 by means of the control link 226.

The end effector 102 includes an end effector node 228 communicatively coupled to the wafer transfer robot 100 by means of external bus 216, while the cassettes 118 include smart cassette nodes 230 that may be communicatively coupled to the wafer transfer robot 100 or to each other by the external bus 216. The end effector node 228 may include the wafer edge detection module 112 or the wafer edge detection module 112 may be included in its own node that is coupled to the end effector node 228 to provide sensor date from the wafer edge detection module 112. Cassette nodes 230 may also optionally be coupled to the host computer 206 by means of control link 226. Finally, track 204, which positions the wafer transfer robot 100 linearly, includes a track node 232 that is coupled to the wafer transfer robot 100 by the external bus 216 and optionally the control link 226 to the host computer 206.

In use, the wafer transfer system 200 operates under the control of the host computer 206 and/or the master node 208 to move wafers between cassettes 118 and/or between the cassettes 118 and stations like the prealigner 202, to accomplish wafer transfers required by the fabrication facility.

Each node in the robot (and optionally also in other components) is composed of multiple integrated circuits (for example, a microprocessor or a field programmable logic array) that work together to perform assigned tasks. The data exchanged between nodes is organized into application specific transactions that direct actions on each node.

Figure 3:
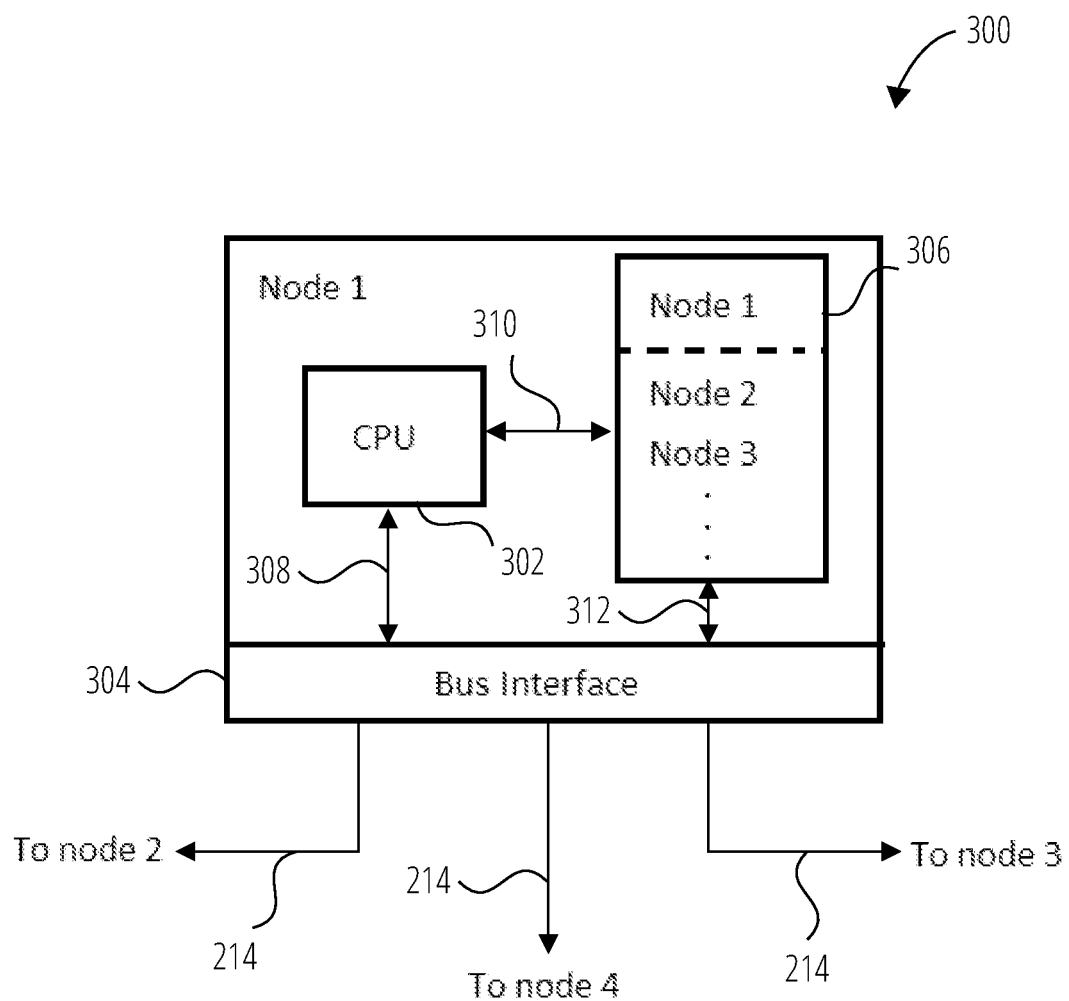
FIG. 3 illustrates an example of one of the nodes of the wafer transfer system shown in FIG. 2.

FIG. 3 schematically illustrates a node 300 in one example. The node 300 corresponds to one or more of the nodes illustrated in FIG. 2, e.g. master node 208, motor node 210, sensor node 212, end effector node 228 etc. As can be seen, the node includes a CPU 302, a bus interface 304 and a hardware information register 306. The CPU 302 controls the overall function of the node 300 and communicates with the bus interface 304 via bus 308 and with hardware information register 306 via bus 310. The hardware information register 306 includes hardware state data for the node 300 itself (for example positional data at motor node 210 or sensor data from sensor nodes 212) (indicated by "Node 1 in hardware information register 306) as well as hardware state data for other nodes (indicated by "Node 2," "Node 3" etc.) The hardware information register 306 transmits and receives hardware state data to and from other nodes via bus 312 and bus interface 304. The bus interface 304 in turn communicates with other nodes via the internal bus 214. Hardware state data is any data that characterizes the operation of the wafer transfer system 200, including sensor data representing vacuum levels, robot arm and end effector positions, optical sensor outputs, data transmission parameters within the internal bus 214 or external bus 216, etc.

At initialization of the wafer transfer system 200, the internal bus 214 performs transactions to establish communications between adjacent nodes 300. If a communications link is successfully established, the transfer of hardware state data (from each node's hardware information register 306) between adjacent nodes 300 starts. If the system consists of more than two non-adjacent nodes 300, data from non-adjacent nodes is exchanged in a relay fashion, for example in FIG. 2 from master node 208 to motor node 210 to sensor node 212 to end effector node 228 and vice versa. This hardware state data exchange continues for the duration that the system is operational. Software data exchange is accomplished by the CPU 302 writing a request to a data register in a bus controller for the bus interface 304. The software transfer is then scheduled and accomplished by the bus controller, but priority is given to the hardware state data as discussed in more detail below.

Hardware state data and software messages are exchanged over the internal bus 214 using a data packet having the following format:
Header Data CRC
The packet header includes a packet ID, a source address, a destination address, a data type identifier, and a received packet confirmation. The data included in the packet can be any relevant data or commands. A cyclic redundancy check (CRC) value is included to permit the determination of whether or not any of the data have been corrupted during transmission of the packet.

Packets containing hardware state data are transmitted every alternate packet. Other data, for example software request/reply commands or data from sensors that change relatively slowly (e.g. temperature sensors), are transmitted between alternating hardware state data packets. The priority of the other data is determined by the bus controller.

A packet received by one node is transmitted to all the other nodes (except the node from which it is received), regardless of the destination address of the packet. If a packet received by a node is addressed to that node, any request or reply commands are executed by that node and any hardware state information for other nodes is updated in the hardware information register 306. Even though the packet is addressed to a receiving node, it is nevertheless transmitted to adjacent nodes so that their hardware information registers 306 can be updated with any hardware state information in the packet.

If a received packet is not addressed to a node, that node will ignore any request or reply commands in the packet but will update its hardware information register 306 with any hardware state information in the packet from other nodes contained in the packet. Prior to transmitting any packet to an adjacent node, any updated hardware state information for the transmitting node 300 is included in the packet. This transmission protocol is thus stateless and session-less, and provides reliable transfer of both hardware state data and software request/reply commands between nodes 300.

An advantage of this protocol is that hardware state data is transmitted rapidly between the nodes. Also, since hardware state data is transmitted in every alternate packet, and it is known how many transmission steps occur between non-adjacent nodes, the time delay between a hardware state update at one node and the receipt of that updated state at another node is known. This permits accurate control and diagnostics.

Figure 4:
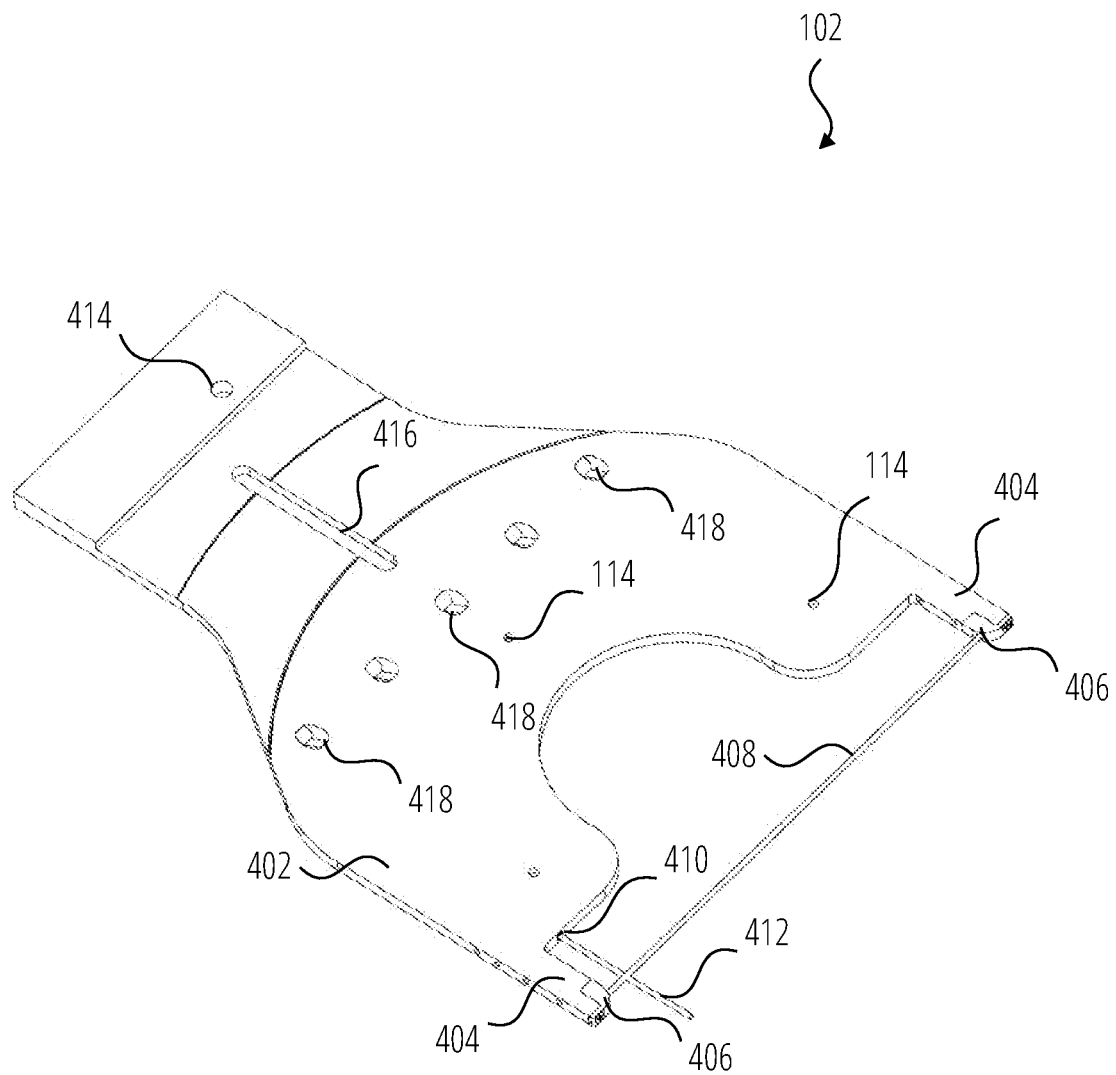
FIG. 4 illustrates a perspective view of part of an end effector in accordance with one embodiment.

FIG. 4 illustrates perspective view of part of an end effector 102 in accordance with one embodiment. The end effector 102 comprises a body 402 and two arms 404. Each arm 404 of the end effector 102 is equipped with sensor components 406, which in the illustrated embodiment comprise a through-beam emitter and a through-beam sensor that in use provide a beam 408 that can detect the presence of a wafer 116 in the cassette 118 when the beam 408 is interrupted by the wafer 116. A proximity sensor 410 (e.g. a retro-reflective laser light sensor, ultrasonic, or time-of-flight sensor), which can detect the proximity of an object near the end effector 102 via a beam 412 may also be provided for collision prevention.

Also included in the body 402 are vacuum ports 114, sensor region 418 and a through-region or aperture in the form of a slot 416 in the illustrated embodiment. The vacuum ports 114 are connected via a channel in the end effector 102 to a vacuum line interconnect 414 that is in use connected to a vacuum supply. The vacuum ports 114 are used to secure an item such as a wafer 116 on top of the end effector 102.

The sensor regions 418 are photosensitive or reflective and are either able to detect the presence or absence of a beam, or, if struck by a beam will reflect it back to a photosensor, as will be discussed further in FIG. 5.

The slot 416 is positioned, shaped and sized such that a wafer located in a reasonably expected position on the end effector 102 will partially obscure the slot 416. The slot 416 is positioned over a central axis of movement of the end effector 102. Also, as can be seen in FIG. 4 and FIG. 5, the sensor regions 418 are spaced apart on the end effector 102 along a direction that is transverse to the central axis of movement of the end effector 102.

Figure 5:
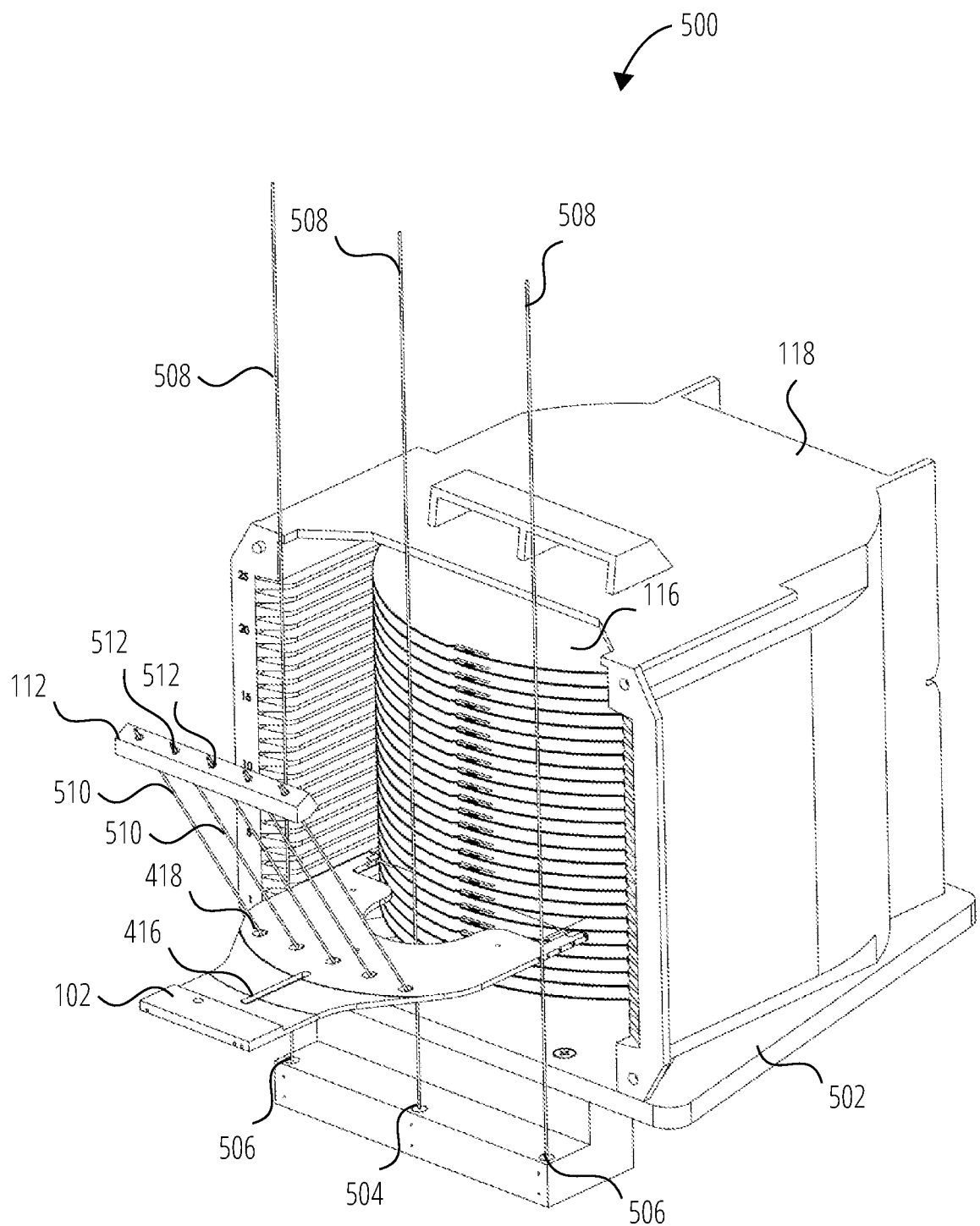
FIG. 5 illustrates a wafer transfer station 500 in accordance with one embodiment.

FIG. 5 illustrates a wafer transfer station 500 in accordance with one embodiment. The wafer transfer station 500 includes a wafer transfer base plate 502, a wafer transfer cassette 118 containing a plurality of semiconductor wafers 116, and a wafer transfer robot 100 (most of which has been omitted in the figure for clarity) that includes an end effector 102 and a wafer edge detection module 112. As can be seen in FIG. 4 and FIG. 5, the wafer edge detection module 112 is offset from the sensor regions 418 along the central axis of movement of the end effector 102, such that beams emitted by the wafer edge detection module 112 are oblique to the upper surface of the end effector 102.

The base plate 502 includes a central upward facing protrusion sensor 504 and two laterally-spaced upwardly-firing protrusion sensors 506, each of which emit an up-firing beam 508. The sensor 504 and sensors 506 could for example be focused laser light sensors that include a photosensitive detector element that will detect the interruption/reflection of the up-firing beams 508 when a wafer 116 passes over the sensor 504 and sensors 506 when the wafer 116 is withdrawn from or inserted into the cassette 118 by the wafer transfer robot 100. As its name suggests, the central sensor 504 is positioned so that its up-firing beam will pass over the approximate center of a wafer being removed from a nominal position in the cassette, and will also pass through the slot 416 when the end effector 102 reaches into or out of the cassette 118 to pick up or deposit a wafer 116. The output from the sensor 504 and sensors 506 is provided to the master node 208 of the wafer transfer robot 100 via external bus 216 or to the 206 via control link 226.

As illustrated in FIG. 5, the wafer edge detection module 112, which is attached to the wafer transfer robot 100 as shown in FIG. 1, comprises a plurality of downward looking edge detection sensors 512. In one example embodiment, the wafer edge detection modules 112 may be implemented as focused laser light emitters that emit a plurality of beams 510 that are focused at the sensor regions 418 on end effector 102. The wafer edge detection module 112 may also include photosensitive detector elements that will detect the reflection of the beam 510 from sensor regions 418 when a wafer 116 is not present on the end effector 102 and will detect the loss of reflection when a wafer 116 interrupts the path between an edge detection sensor 512 and a sensor region 418, for example when the end effector 102 reaches into a cassette to withdraw a wafer. Alternatively, as discussed above with reference to FIG. 4, the sensor regions 418 may themselves be photosensitive instead of reflective, to detect when the beams 510 are interrupted by the presence of a wafer.

As discussed above with reference to FIG. 2 and FIG. 3, the wafer transfer robot 100 receives positional data from sensor nodes 212, motor nodes 210 and/or end effector node 228. In particular, the data from these sensors can be used to derive a value for the displacement of the end effector 102 in a radial dimension from the center of the support column 106, or, stated differently, a value of the displacement of the end effector 102 as it moves in a straight line into or out of a cassette 118 to retrieve a wafer. The value of the displacement can be captured whenever one of the beams 510 or up-firing beams 508 transition between a state of being interrupted and a state of being not interrupted, and appropriate determinations, adjustments or decisions can be made.

Also, the relationship of the edge detection sensors 512 with respect to each other is fixed and in a straight line that is perpendicular to the motion of the end effector 102 as it reaches into the cassette 118. This means that the position of the end effector 102 when each beam 510 transitions between a state of being interrupted and not interrupted will provide relative displacements in two dimensions, one dimension based on the linear movement of the end effector 102 and the other based on the distances between edge detection sensors 512. Similarly, the relationship of the sensors 506 and the sensor 504 with respect to each other is fixed and in a straight line that is perpendicular to the motion of the end effector 102 as it reaches into the cassette 118. This means that the position of the end effector 102 when each up-firing beam 508 transitions between a state of being interrupted and not interrupted will provide relative displacements in two dimensions, one dimension based on the linear movement of the end effector 102 and the other based on the distance between the sensors 506 and/or sensor 504.

In particular, when end effector 102 with a wafer 116 thereon is withdrawn from the cassette, the beam 508 corresponding to the sensor 504 will initially pass uninterrupted through slot 416 until it is interrupted by the edge of the wafer that overlies part of the slot 416. The beam will then remain interrupted until the other edge of the wafer 116 completely leaves the cassette 118. The difference between the two displacement values that are captured when the beam transitions to interrupted and then transitions back to interrupted, will provide a measure of the diameter of the wafer, and the half-way point between these two measurements will provide an indication of the center of the wafer.

The accuracy of the diameter and center of the wafer determined in this manner will be affected by the presumption that the wafer is centered in a side-to-side direction in the cassette 118 and that the end effector is centered in a side-to-side direction as it leaves the cassette 118, and that the wafer is completely round. In reality, the wafer may include a notch or a flat on its edge that will reduce the measured diameter of the wafer and offset the determined center of the wafer 116. However, the side-to-side positioning of the wafer in the cassette 118 is within a known tolerance, and the size of a notch or flat is also within a known tolerance. Accordingly, the uncertainty regarding the position of the wafer may for example be 5 mm, but this still provides useful information for wafer operations as discussed further below. Additionally, even with the uncertainty resulting from the possible presence of a notch, the reduction in uncertainty of the location of the center of the wafer 116 in the direction of movement of the end effector 102 resulting from the two data points is significant. This is because the wafer is less constrained in this direction and may be protruding from the cassette 118 up to but not to the point of breaking the up-firing beam 508 corresponding to the protrusion sensor 504.

The up-firing beams 508 corresponding to sensors 506 will also transition from an uninterrupted state to an interrupted state and back to an uninterrupted state when a wafer 116 is withdrawn from or inserted into the cassette 118. This will provide four measurements corresponding to the edge of the wafer 116. If used in conjunction with measurements derived from transitions detected by sensor 504, this will provide six measurements corresponding to the edge of the wafer. The diameter and center of a circle can be determined from at least three of these measurements using known techniques, instead of or in addition to the measurements taken using the sensor 504.

Referring now to the wafer edge detection module 112, when the end effector 102 reaches into the cassette 118 to retrieve a wafer, the beams 510 between the edge detection sensors 512 and the sensor regions 418 will be broken by the edge of the wafer 116 as the end effector reaches underneath the wafer 116 to pick it up. As the breakage of each beam 510 is detected, the corresponding linear position of the end effector 102 is captured. This will result in as many measurements of the location of the edge of the wafer 116 as there are edge detection sensors 512, or five in the illustrated embodiment. The diameter and center of a circle can be determined from at least three such measurements using known techniques.

The determination of the center can be performed with some or all of the data collected as a result of transitions of state of sensor 504, sensors 506 and edge detection sensors 512, or some combination thereof, to reduce uncertainty that may result from the presence of features on the edge of the wafer, such as notches or flat sections.

Figure 6A:
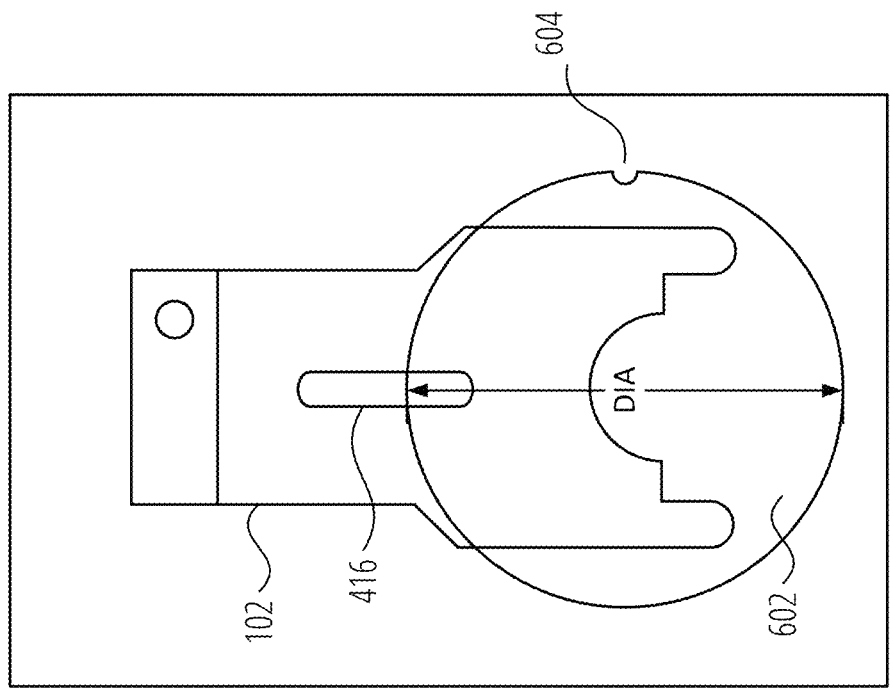
FIG. 6A illustrates a plan view of an end effector having a wafer thereon.
Figure 6B:
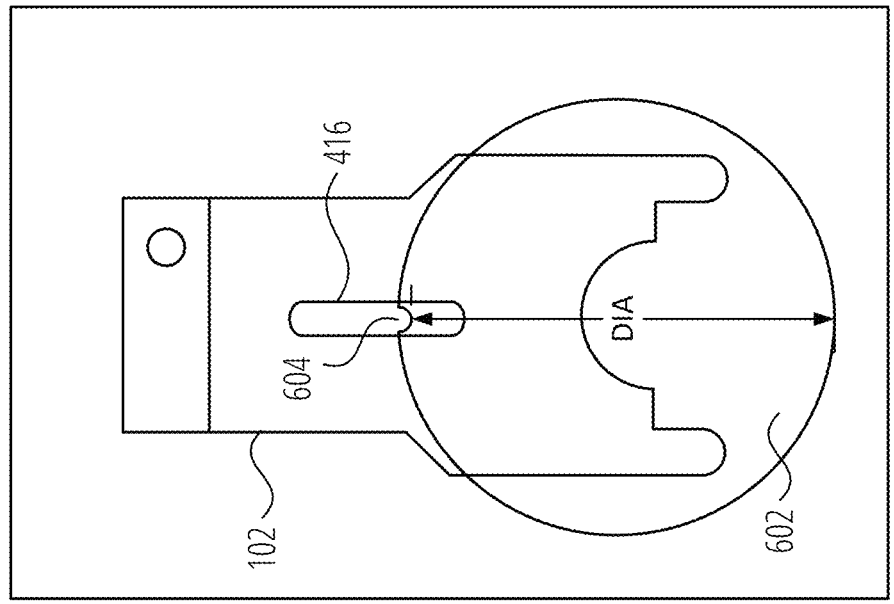
FIG. 6B illustrates another plan view of an end effector having a wafer thereon.

FIG. 6A and FIG. 6B illustrate uncertainty in the determination of a diameter and center of a wafer 602 having a notch 604 or other feature such as a flat, when using the central sensor 504 and the slot 416. As can be seen in FIG. 6A, when the notch 604 is offset from the slot, the measurement of the diameter will be unaffected by presence of the notch 604. As shown in FIG. 6B, if the notch 604 is partially or directly aligned with the slot 416 (at either end of the wafer 602), then the measurement of the diameter of the wafer 602 will be less than the actual diameter of the wafer 602 by an amount equal to no more than the depth of the slot 416 or other feature, and the determination of the center will be off by an amount equal to half the depth of the notch 604 or other feature. In the event that this uncertainty is too great, the determination of the diameter and center of the wafer 602 can be verified or compared with determinations based on data gathered using transitions detected by sensors 506 and/or wafer edge detection module 112.

Figure 7:
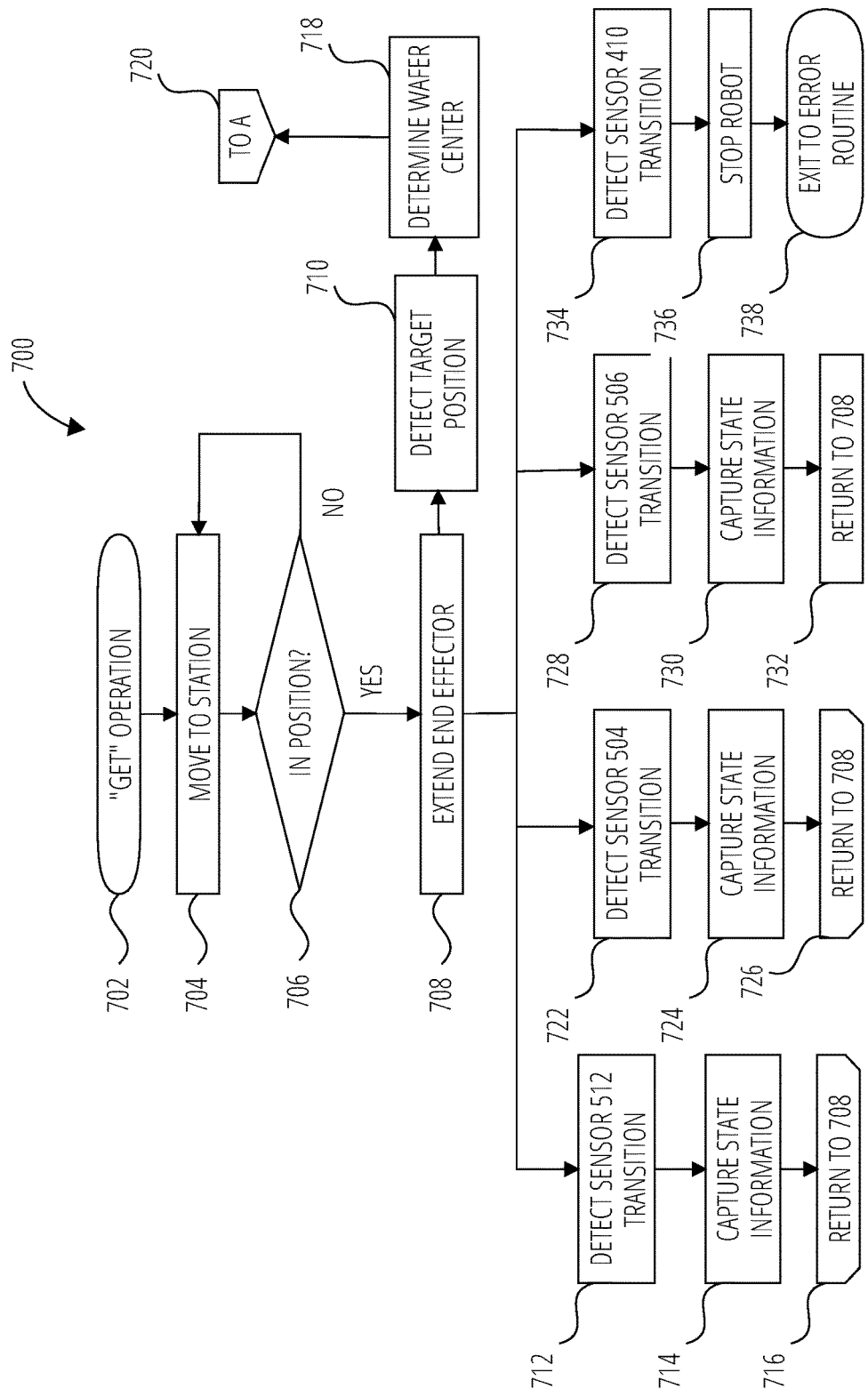
FIG. 7 illustrates part of a flowchart showing a method of transferring a wafer from a cassette onto the end effector according to one embodiment.

FIG. 7 is a flowchart 700 showing a method of transferring a wafer 116 from a cassette 118 onto the end effector 102 with the goal of transferring the wafer 116 to another station in the wafer processing facility. Flowchart 700 provides an example for using the sensor 504, sensors 506 and/or edge detection sensors 512 to effect the wafer transfer. Other data required by the method is supplied by the wafer transfer station 500, specifically the position of the wafer transfer robot 100, in particular the location of the end effector 102. In addition, the master node 208 and/or host computer 206 may use the data from sensor 504, sensors 506 and/or edge detection sensors 512 to control the wafer transfer robot 100 to perform operations not described by the method disclosed in flowchart 700. For example, instead of or in addition to the method disclosed in flowchart 700, the wafer transfer system 200 may combine data from vacuum sensors, accelerometers, timing or other sensors not described herein to affect the operation of the wafer transfer robot 100.

The method begins at operation 702 with the wafer transfer robot 100 in a first operating state, in which the wafer transfer robot 100 is able to start a wafer "get" operation to transfer a wafer 116 onto the end effector 102. The wafer transfer robot 100 is commanded by the master node 208 to "move to station" at operation 704. The wafer transfer robot 100 begins moving on one or more of its allowed axes of motion to position the end effector 102 in front of the wafer transfer cassette 118 at the appropriate height to retrieve a specific wafer 116 from the cassette 118. At operation 706 the master node 208 checks to see if the wafer transfer robot 100 is in position to move the end effector 102 into the cassette 118. If the wafer transfer robot is in position, the method continues at operation 708. If it is not in position, the movement of the robot at operation 704 continues.

At operation 708, the master node 208 commands the wafer transfer robot 100 to extend the end effector 102 into the cassette 118 underneath a wafer to be picked up, and also enables and monitors the sensor 504, sensors 506 and/or edge detection sensors 512 to permit detection of the wafer edge as discussed above, when the end effector 102 is in the proximity of a wafer 116. As the end effector 102 is extended by the wafer transfer robot 100, various operations may be performed to monitor the progress of the motion.

At operation 712, if a state transition of one of the edge detection sensors 512 is detected, the method continues at operation 714, where the sensor state, the robot position and the transition (on-to-off or off-to-on) is captured and recorded in the memory of the master node 208. Transitions observed by edge detection sensors 512 occur when the edge of wafer 116 intersects the beam 510. As the end effector 102 is in motion, and wafer 116 is generally circular, transitions of edge detection sensors 512 occur at distinctly different times and robot positions. The method then returns at operation 716 to operation 708 with continued extension of the end effector.

At operation 722, if a state transition of the central up-facing sensor 504 is detected, the method continues at operation 724, where the sensor state, the robot position and the transition (on-to-off or off-to-on) is captured and recorded in the memory of the master node 208. As the end effector 102 is in motion, if no wafer 116 is on the end effector 102, the front edge of the end effector 102 passing the sensor 504 will be the first transition detected, the front edge of the slot 416 crossing the sensor 504 will be the second transition detected, and the back edge of the slot 416 crossing the sensor 504 will be the third transition detected. When a wafer 116 is present, the observed transitions indicate the leading and trailing edge of the wafer 116 and the back edge of the slot 416. The method then returns at operation 726 to operation 708 with continued extension of the end effector.

At operation 728, if a state transition of one of the up-facing sensors 506 is detected, the method continues at operation 730, where the sensor state, the robot position and the transition (on-to-off or off-to-on) is captured and recorded in the memory of the master node 208. If no wafer 116 is on the end effector, no transitions of sensors 506 will be detected as the end effector 102 moves into the cassette. When a wafer 116 is present, the observed transitions of sensors 506 indicate the leading and trailing edge of the wafer 116. The method then returns at operation 732 to operation 708 with continued extension of the end effector.

At operation 734, if a state transition of the forward-looking proximity sensor 410 sensor is detected, the method continues at operation 736 with the wafer transfer robot 100 being brought to a halt. The normal flow of processing is interrupted and the method exits at operation 738 to an error routine.

In normal operation, the movement of the wafer transfer robot 100 will continue until, at operation 710, is detected that the end effector 102 has reached its target position. When it does, center of the wafer is determined at operation 708. Operation 708 combines the data captured when the sensor transitions occur. The presence/absence of a wafer 116 on the end effector 102, its diameter and the location of its center can be determined. The method then proceeds as shown in FIG. 8, at operation 720.

Figure 8:
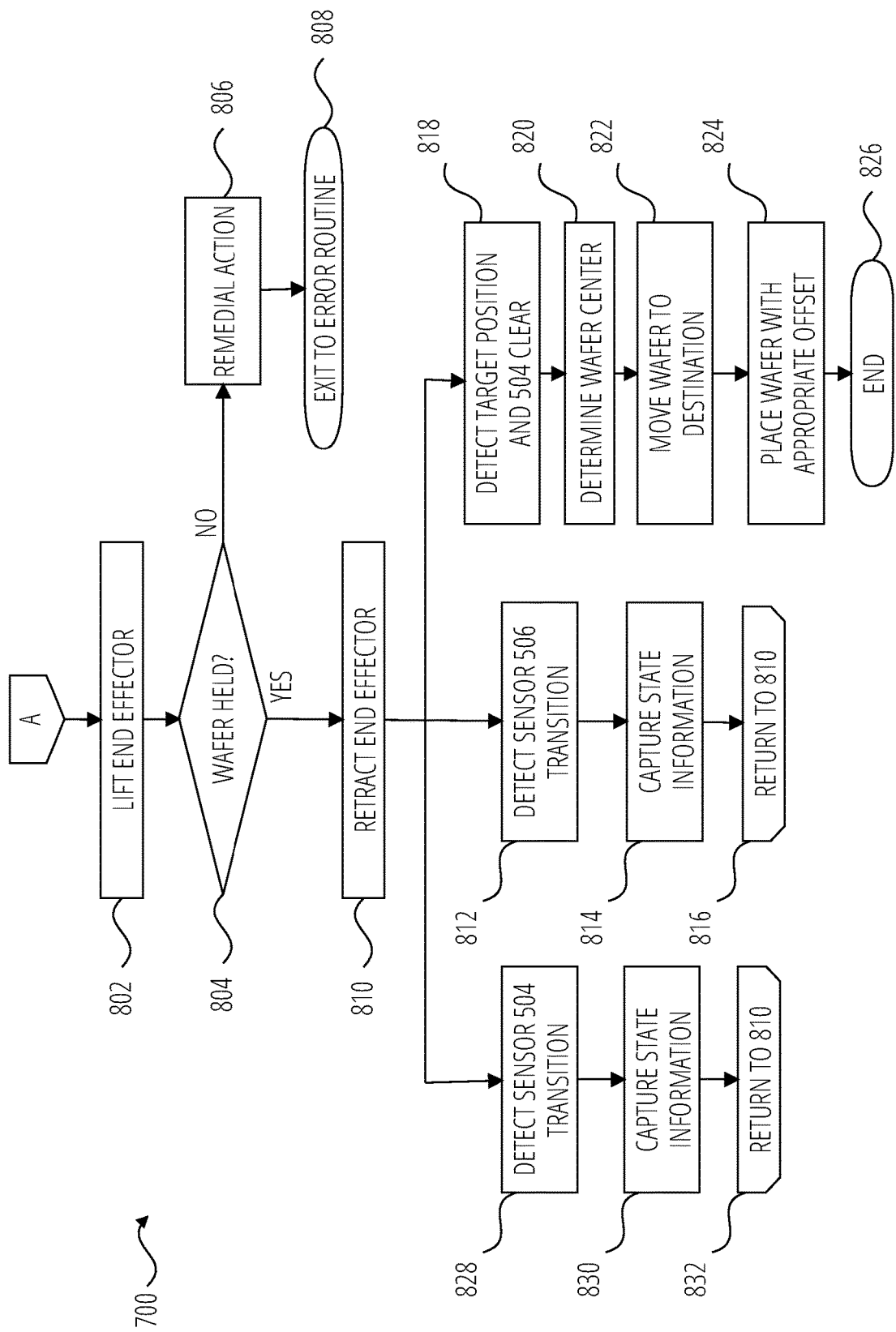
FIG. 8 illustrates the rest of the flowchart of FIG. 7.

FIG. 8 is a continuation of the flowchart 700 showing a method of transferring a wafer 116 from a cassette 118 onto the end effector 102 with the goal of transferring the wafer 116 to another station in the wafer processing facility.

The method continues at operation 802 with the master node 208 instructing the wafer transfer robot 100 to lift the end effector 102 by an amount that would be expected to lift the wafer 116 off the rails of the cassette. At this point, the vacuum ports 114 should have engaged the wafer 116 and the vacuum level at the vacuum ports 114 should rise to indicate that the wafer 116 is held on the end effector 102.

At operation 804, it is checked to see if the wafer 116 is in fact held on the end effector 102. If the wafer 116 is not properly held, the method passes to operation 806, in which the master node 208 performs a remedial action that would typically include stopping the robot motion, and the method exits to an error routine at operation 808.

If the wafer is securely held, the method proceeds at operation 810 with the master node 208 instructing the wafer transfer robot 100 to retract the end effector 102 from the cassette 118. As the end effector 102 is retracted by the wafer transfer robot 100, various operations may be performed to monitor the progress of the motion.

At operation 828, if a state transition of the central up-facing sensor 504 is detected, the method continues at operation 830, where the sensor state, the robot position and the transition (on-to-off or off-to-on) is captured and recorded in the memory of the master node 208. With a wafer 116 present, the observed transitions of sensor 504 will indicate the back edge of the slot 416, followed by the leading and trailing edge of the wafer 116. The method then returns at operation 832 to operation 810 with continued extension of the end effector.

At operation 812, if a state transition of one of the up-facing sensors 506 is detected, the method continues at operation 814, where the sensor state, the robot position and the transition (on-to-off or off-to-on) is captured and recorded in the memory of the master node 208. If no wafer 116 is on the end effector, no transitions of sensors 506 will be detected as the end effector 102 moves out of the cassette. When a wafer 116 is present, the observed transitions of sensors 506 indicate the leading and trailing edge of the wafer 116. The method then returns at operation 816 to operation 810 with continued retraction of the end effector 102

At operation 818, if it is detected that the end effector 102 has reached a target end effector withdrawal position and sensor 504 is not obstructed (i.e. meaning that the wafer 116 has cleared the cassette 118), the center of the wafer 116 is determined at operation 820. Operation 820 combines the data captured when the sensor transitions occur to determine the center using known techniques for determining the center of a circle. The presence/absence of a wafer 116 on the end effector 102, its diameter and the location of its center can be determined. The wafer is then moved to its intended destination at operation 822. Since the center of the wafer 116 has been determined, either at operation 718 or operation 820, the wafer can be placed more accurately at its intended destination at operation 824, resulting in more efficient wafer processing. In particular, the wafer 116 may be placed such that the determined center of the wafer is received at an intended center location at the destination. The method then ends at operation 826.

Machine-readable instructions may be embodied in a non-transitory medium, which, when executed, cause the wafer transfer system 200 or wafer transfer station 500 to execute the method of flowchart 700. Additionally, the instructions may be included in memory or other data storage associated with a wafer transfer robot 100, wafer transfer system 200, and/or wafer transfer station 500.

Figure 9:
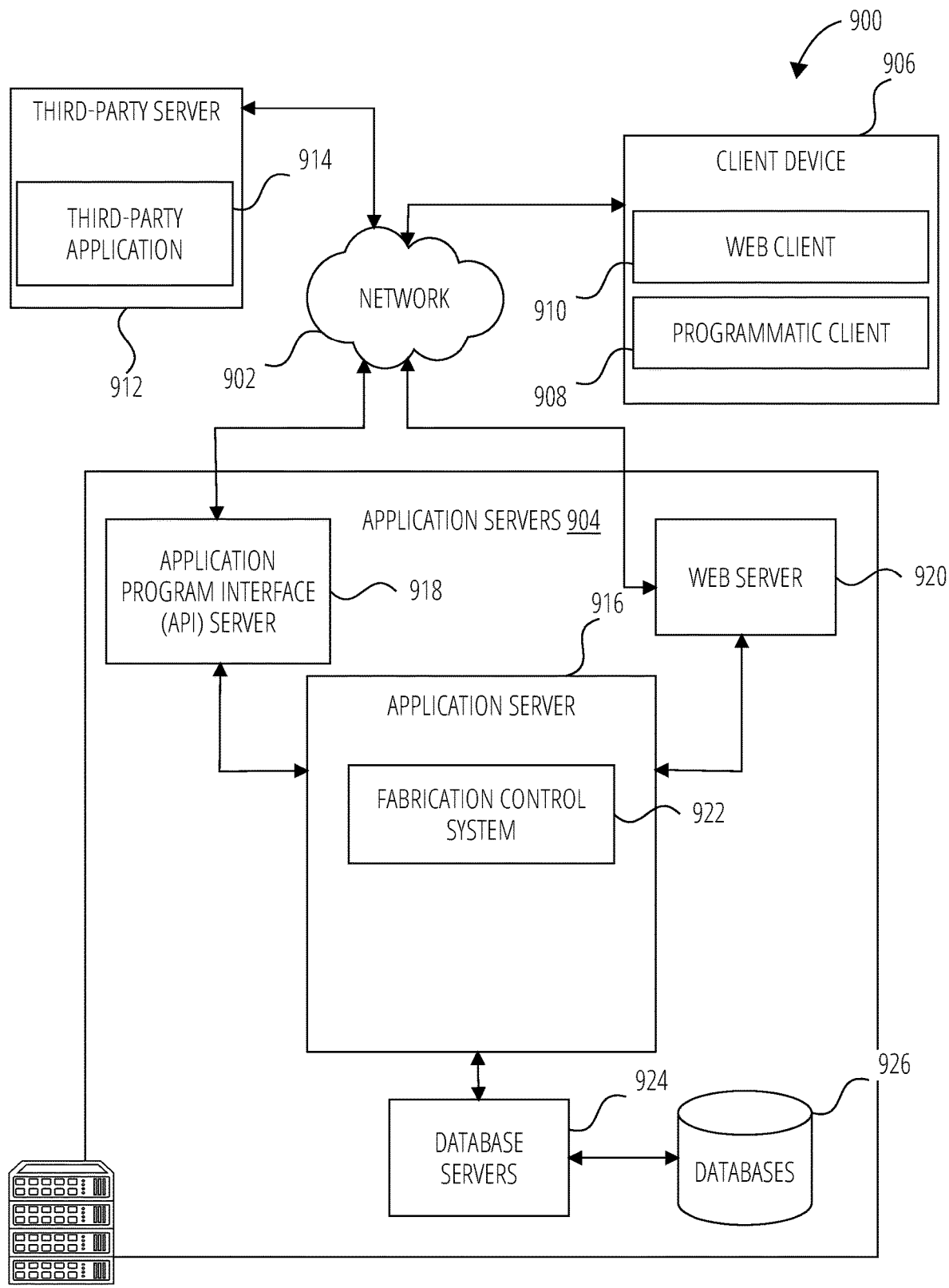
FIG. 9 is a diagrammatic representation of a networked environment in which the present disclosure may be deployed, in accordance with some example embodiments.

FIG. 9 is a diagrammatic representation of a networked computing environment 900 in which some example embodiments of the present disclosure may be implemented or deployed.

One or more application servers 904 provide server-side functionality via a network 902 to a networked user device, in the form of a client device 906. An example of a client device is the wafer transfer robot 100 or one of the nodes 300 therein. A web client 910 (e.g., a browser) and a programmatic client 908 (e.g., an "app") may be hosted and execute on the web client 910.

An Application Program Interface (API) server 918 and a web server 920 provide respective programmatic and web interfaces to application servers 904. A specific application server 916 hosts a fabrication control system 922, which includes relevant components, modules and/or applications.

The web client 910 communicates with the fabrication control system 922 via the web interface supported by the web server 920. Similarly, the programmatic client 908 communicates with the fabrication control system 922 via the programmatic interface provided by the Application Program Interface (API) server 918.

The application server 916 is shown to be communicatively coupled to database servers 924 that facilitates access to an information storage repository or databases 926. In an example embodiment, the databases 926 includes storage devices that store information to be published and/or processed and/or received from the fabrication control system 922.

Additionally, a third-party application 914 executing on a third-party server 912, is shown as having programmatic access to the application server 916 via the programmatic interface provided by the Application Program Interface (API) server 918. For example, the third-party application 914, using information retrieved from the application server 916, may support one or more features or functions on a website hosted by the third party.

Figure 10:
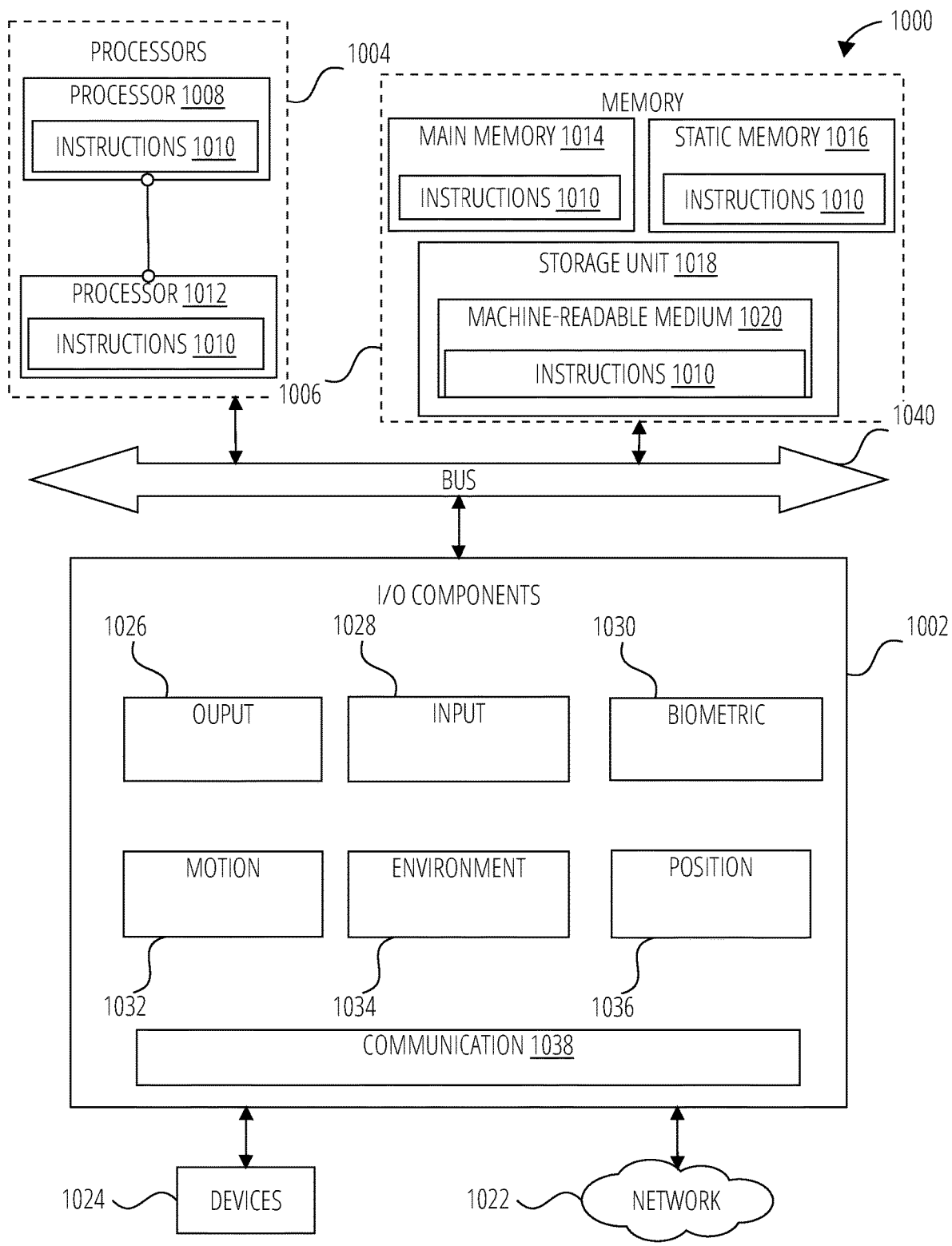
FIG. 10 is a diagrammatic representation of a machine in the form of a computer system within which a set of instructions may be executed for causing the machine to perform any one or more of the methodologies discussed herein, in accordance with some example embodiments.

FIG. 10 is a diagrammatic representation of the machine 1000 within which instructions 1010 (e.g., software, a program, an application, an applet, an app, or other executable code) for causing the machine 1000 to perform any one or more of the methodologies discussed. For example, the instructions 1010 may cause the machine 1000 to execute any one or more of the methods described herein. The instructions 1010 transform the general, non-programmed machine 1000 into a particular machine 1000 programmed to carry out the described and illustrated functions in the manner described. The machine 1000 may operate as a standalone device or may be coupled (e.g., networked) to other machines. In a networked deployment, the machine 1000 may operate in the capacity of a server machine or a client machine in a server-client network environment, or as a peer machine in a peer-to-peer (or distributed) network environment. The machine 1000 may comprise, but not be limited to, a server computer, a client computer, a personal computer (PC), a tablet computer, a laptop computer, a netbook, a set-top box (STB), a PDA, an entertainment media system, a cellular telephone, a smart phone, a mobile device, a wearable device (e.g., a smart watch), a smart home device (e.g., a smart appliance), other smart devices, a web appliance, a network router, a network switch, a network bridge, or any machine capable of executing the instructions 1010, sequentially or otherwise, that specify actions to be taken by the machine 1000. Further, while only a single machine 1000 is illustrated, the term "machine" shall also be taken to include a collection of machines that individually or jointly execute the instructions 1010 to perform any one or more of the methodologies discussed herein.

The machine 1000 may include processors 1004, memory 1006, and I/O components 1002, which may be configured to communicate with each other via a bus 1040. In an example embodiment, the processors 1004 (e.g., a Central Processing Unit (CPU), a Reduced Instruction Set Computing (RISC) Processor, a Complex Instruction Set Computing (CISC) Processor, a Graphics Processing Unit (GPU), a Digital Signal Processor (DSP), an ASIC, a Radio-Frequency Integrated Circuit (RFIC), another Processor, or any suitable combination thereof) may include, for example, a Processor 1008 and a Processor 1012 that execute the instructions 1010. The term "Processor" is intended to include multi-core processors that may comprise two or more independent processors (sometimes referred to as "cores") that may execute instructions contemporaneously. Although FIG. 10 shows multiple processors 1004, the machine 1000 may include a single Processor with a single core, a single Processor with multiple cores (e.g., a multi-core Processor), multiple processors with a single core, multiple processors with multiples cores, or any combination thereof.

The memory 1006 includes a main memory 1014, a static memory 1016, and a storage unit 1018, both accessible to the processors 1004 via the bus 1040. The main memory 1006, the static memory 1016, and storage unit 1018 store the instructions 1010 embodying any one or more of the methodologies or functions described herein. The instructions 1010 may also reside, completely or partially, within the main memory 1014, within the static memory 1016, within machine-readable medium 1020 within the storage unit 1018, within at least one of the processors 1004 (e.g., within the Processor's cache memory), or any suitable combination thereof, during execution thereof by the machine 1000.

The I/O components 1002 may include a wide variety of components to receive input, provide output, produce output, transmit information, exchange information, capture measurements, and so on. The specific I/O components 1002 that are included in a particular machine will depend on the type of machine. For example, portable machines such as mobile phones may include a touch input device or other such input mechanisms, while a headless server machine will likely not include such a touch input device. It will be appreciated that the I/O components 1002 may include many other components that are not shown in FIG. 10. In various example embodiments, the I/O components 1002 may include output components 1026 and input components 1028. The output components 1026 may include visual components (e.g., a display such as a plasma display panel (PDP), a light emitting diode (LED) display, a liquid crystal display (LCD), a projector, or a cathode ray tube (CRT)), acoustic components (e.g., speakers), haptic components (e.g., a vibratory motor, resistance mechanisms), other signal generators, valves and switches and so forth. The input components 1028 may include alphanumeric input components (e.g., a keyboard, a touch screen configured to receive alphanumeric input, a photo-optical keyboard, or other alphanumeric input components), point-based input components (e.g., a mouse, a touchpad, a trackball, a joystick, a motion sensor, or another pointing instrument), tactile input components (e.g., a physical button, a touch screen that provides location and/or force of touches or touch gestures, or other tactile input components), audio input components (e.g., a microphone), and the like.

In further example embodiments, the I/O components 1002 may include biometric components 1030, motion components 1032, environmental components 1034, or position components 1036, among a wide array of other components. For example, the biometric components 1030 include components to detect expressions (e.g., hand expressions, facial expressions, vocal expressions, body gestures, or eye-tracking), measure biosignals (e.g., blood pressure, heart rate, body temperature, perspiration, or brain waves), identify a person (e.g., voice identification, retinal identification, facial identification, fingerprint identification, or electroencephalogram-based identification), and the like. The motion components 1032 include acceleration sensor components (e.g., accelerometer), gravitation sensor components, rotation sensor components (e.g., gyroscope). The environmental components 1034 include, for example, one or cameras, illumination sensor components (e.g., photometer), temperature sensor components (e.g., one or more thermometers that detect ambient temperature), humidity sensor components, pressure sensor components (e.g., barometer), acoustic sensor components (e.g., one or more microphones that detect background noise), proximity sensor components (e.g., infrared sensors that detect nearby objects), gas sensors (e.g., gas detection sensors to detection concentrations of hazardous gases for safety or to measure pollutants in the atmosphere), vacuum sensors or other components that may provide indications, measurements, or signals corresponding to a surrounding physical environment. The position components 1036 include location sensor components (e.g., a GPS receiver Component), altitude sensor components (e.g., altimeters or barometers that detect air pressure from which altitude may be derived), orientation sensor components (e.g., magnetometers), and the like.

Communication may be implemented using a wide variety of technologies. The I/O components 1002 further include communication components 1038 operable to couple the machine 1000 to a network 1022 or devices 1024 via respective coupling or connections. For example, the communication components 1038 may include a network interface Component or another suitable device to interface with the network 1022. In further examples, the communication components 1038 may include wired communication components, wireless communication components, cellular communication components, Near Field Communication (NFC) components, Bluetooth® components (e.g., Bluetooth® Low Energy), Wi-Fi® components, and other communication components to provide communication via other modalities. The devices 1024 may be another machine or any of a wide variety of peripheral devices (e.g., a peripheral device coupled via a USB).

Moreover, the communication components 1038 may detect identifiers or include components operable to detect identifiers. For example, the communication components 1038 may include Radio Frequency Identification (RFID) tag reader components, NFC smart tag detection components, optical reader components (e.g., an optical sensor to detect one-dimensional bar codes such as Universal Product Code (UPC) bar code, multi-dimensional bar codes such as Quick Response (QR) code, Aztec code, Data Matrix, Dataglyph, MaxiCode, PDF417, Ultra Code, UCC RSS-2D bar code, and other optical codes), or acoustic detection components (e.g., microphones to identify tagged audio signals).

In addition, a variety of information may be derived via the communication components 1038, such as location via Internet Protocol (IP) geolocation, location via Wi-Fi® signal triangulation, location via detecting an NFC beacon signal that may indicate a particular location, and so forth.

The various memories (e.g., main memory 1014, static memory 1016, and/or memory of the processors 1004) and/or storage unit 1018 may store one or more sets of instructions and data structures (e.g., software) embodying or used by any one or more of the methodologies or functions described herein. These instructions (e.g., the instructions 1010), when executed by processors 1004, cause various operations to implement the disclosed embodiments.

The instructions 1010 may be transmitted or received over the network 1022, using a transmission medium, via a network interface device (e.g., a network interface Component included in the communication components 1038) and using any one of several well-known transfer protocols (e.g., hypertext transfer protocol (HTTP)). Similarly, the instructions 1010 may be transmitted or received using a transmission medium via a coupling (e.g., a peer-to-peer coupling) to the devices 1024.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Although an overview of the inventive subject matter has been described with reference to specific example embodiments, various modifications and changes may be made to these embodiments without departing from the broader scope of embodiments of the present disclosure. Such embodiments of the inventive subject matter may be referred to herein, individually or collectively, by the term "invention" merely for convenience and without intending to voluntarily limit the scope of this application to any single disclosure or inventive concept if more than one is, in fact, disclosed.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The Detailed Description, therefore, is not to be taken in a limiting sense, and the scope of various embodiments is defined only by the appended claims, along with the full range of equivalents to which such claims are entitled.

As used herein, the term "or" may be construed in either an inclusive or exclusive sense. Moreover, plural instances may be provided for resources, operations, or structures described herein as a single instance. Additionally, boundaries between various resources, operations, modules, engines, and data stores are somewhat arbitrary, and particular operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

What is claimed is:

1. A robot system, comprising:
a robot arm;
an end effector coupled to the robot arm for receiving an item, the end effector having an aperture defined within the end effector, the aperture being partially covered by the item along a first edge of the item when the item is received by the end effector;
one or more data processors in communication with the robot arm to control operation of the robot system and to receive data from a first sensor that can detect obstruction thereof as the end effector is moved past the first sensor, the one or more data processors being programmed to cause the system to perform operations comprising:
moving the end effector with an item thereon relative to an item cassette past the first sensor with the aperture aligned with the first sensor;
receiving first sensor data indicating an obstruction of the first sensor by the first edge of the item;
capturing first robot positional information related to the first sensor data;
continuing to move the end effector past the first sensor until a second edge of the item passes the first sensor, the second edge of the item being located on an opposite side of the item from the first edge;
receiving second sensor data indicating that the first sensor is no longer obstructed based on the second edge of the item passing the first sensor; and
capturing second robot positional information related to the second sensor data.

2. The robot system of claim 1 wherein the aperture in the end effector overlies a central axis of the end effector.

3. The robot system of claim 2, wherein the operations further comprise:
determining a center of the item from the first and second robot positional information; and
placing the item such that the determined center of the item is received at an intended center location.

4. The robot system of claim 1, wherein the one or more data processors receive data from second and third sensors that can detect obstruction as the end effector is moved past the first sensor, each of the second and third sensors being offset from the first sensor along a direction that is transverse to the direction of motion of the item, the operations further comprising:
receiving additional sensor data from the second and third sensors when the second and third sensors either become obstructed by the item or become not obstructed by the item;
capturing additional robot positional data related to the additional sensor data; and
determining a center of the item from information selected from the group consisting of the first and second robot positional information and the additional robot positional data.

5. The robot system of claim 4, wherein the operations further comprise:
placing the item such that the determined center of the item is received at an intended center location.

6. A robot system, comprising:
a robot arm;
an end effector coupled to the robot arm for receiving an item, the end effector having an aperture defined therein that is within the end effector, the aperture being partially covered by the item along a first edge of the item when the item is received by the end effector, the end effector having a plurality of sensor regions located adjacent to the aperture that are obscured when the item is received by the end effector, the plurality of sensor regions being spaced apart on the end effector along a direction that is transverse to a central axis of movement of the end effector; and
a sensor module coupled to the end effector, the sensor module being directed at the plurality of sensor regions on the end effector, the sensor module and the plurality of sensor regions in combination being operable to detect when the item obscures each individual sensor region of the plurality of sensor regions when the end effector is moved relative to the item.

7. The robot system of claim 6, further comprising:
one or more data processors in communication with the robot arm to control operation of the robot system, the one or more data processors being programmed to cause the system to perform operations comprising:
moving the end effector into position to engage the item;
receiving sensor data indicating obstruction of each of the plurality of sensor regions by the item; and
capturing robot positional information corresponding to a location of the end effector when each of the plurality of sensor regions are obstructed by the item.

8. The robot system of claim 7, wherein the operations further comprise:
determining a center of the item from the robot positional information; and
placing the item such that the determined center of the item is received at an intended center location.

9. The robot system of claim 6 wherein the sensor regions are reflective.

10. The robot system of claim 6 wherein the sensor regions comprise optical sensors.

11. The robot system of claim 6, wherein the sensor module is offset from the plurality of sensor regions along the central axis of motion of the end effector.

12. The robot system of claim 6, wherein the sensor module emits light beams that are oblique to an upper surface of the end effector.

13. The robot system of claim 6, further comprising:
a base plate for receiving an item cassette with an open side of the item cassette facing an edge of the base plate;
a plurality of vertically directed optical sensors adjacent to the edge of the base plate, the plurality of optical sensors being spaced apart along the edge of the base plate, the plurality of sensors in use indicating a transition between a state of being interrupted and not being interrupted when an item is moved into or out of the item cassette.

14. A robot system, comprising:
a robot arm;
an end effector coupled to the robot arm for receiving an item, the end effector having an aperture defined therein that is within the end effector, the aperture being partially covered by the item along a first edge of the item when the item is received by the end effector;
a base plate for receiving an item cassette with an open side of the item cassette facing an edge of the base plate;
a plurality of vertically directed optical sensors adjacent to the edge of the base plate, the plurality of optical sensors being spaced apart along the edge of the base plate, the plurality of optical sensors in use indicating a transition between a state of being interrupted and not being interrupted when an item is moved into or out of the item cassette;
one or more data processors in communication with the robot arm to control operation of the robot system, the one or more data processors being programmed to cause the system to perform operations comprising:
moving the end effector with an item thereon past the plurality of vertically arranged directed optical sensors;
receiving sensor data indicating a transition between a state of being interrupted and not being interrupted for each of the plurality of vertically directed optical sensors; and
capturing robot positional information when the sensor data indicates that each of the plurality of vertically directed optical sensors has transitioned between a state of being interrupted and not being interrupted.

15. The robot system of claim 14, wherein the operations further comprise:
determining a center of the item from the robot positional information; and
placing the item such that the determined center of the item is received at an intended center location.

16. The robot system of claim 14, wherein the end effector has a plurality of sensor regions that are obscured when the item is received by the end effector, the plurality of sensor regions being spaced apart on the end effector along a direction that is transverse to a central axis of movement of the end effector, the robot system further comprising:
a sensor module coupled to the end effector, the sensor module being directed at the plurality of sensor regions on the end effector, the sensor module and the sensor regions in combination being operable to detect when the item obscures each individual sensor region of the plurality of sensor regions when the end effector is moved relative to the item.

17. The robot system of claim 16 wherein the sensor module is offset from the plurality of sensor regions along the central axis of motion of the end effector.

18. The robot system of claim 16 wherein the sensor module emits light beams that are oblique to an upper surface of the end effector.

19. The robot system of claim 14, wherein the aperture defined within the end effector is in a central portion of the end effector, the aperture being aligned with one of the plurality of vertically directed optical sensors.

20. The robot system of claim 19, wherein the operations further comprise:
capturing robot positional information corresponding to a location of the end effector when the one of the plurality of vertically directed optical sensors that is aligned with the aperture indicates a transition between a state of being interrupted and not being interrupted by the edge of an item that is partially covering the aperture.

* * * * *